US012588263B2

(12) United States Patent
Minamikawa et al.

(10) Patent No.: US 12,588,263 B2
(45) Date of Patent: Mar. 24, 2026

(54) INSULATED GATE BIPOLAR TRANSISTOR (IGBT) SEMICONDUCTOR DEVICE WITH REDUCED TURN-ON LOSS

(71) Applicants:Kabushiki Kaisha Toshiba, Tokyo (JP); Toshiba Electronic Devices & Storage Corporation, Tokyo (JP)

(72) Inventors: Kazuki Minamikawa, Nomi Ishikawa (JP); Daiki Yoshikawa, Kanazawa Ishikawa (JP); Norio Yasuhara, Kanazawa Ishikawa (JP); Kazutoshi Nakamura, Nonoichi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 624 days.

(21) Appl. No.: 17/939,025

(22) Filed: Sep. 7, 2022

(65) Prior Publication Data

US 2023/0307509 A1 Sep. 28, 2023

(30) Foreign Application Priority Data

Mar. 23, 2022 (JP) ................................. 2022-047254
Sep. 5, 2022 (JP) ................................. 2022-140947

(51) Int. Cl.
*H10D 64/00* (2025.01)
*H10D 12/00* (2025.01)
*H10D 62/10* (2025.01)

(52) U.S. Cl.
CPC ......... *H10D 64/112* (2025.01); *H10D 12/481* (2025.01); *H10D 62/127* (2025.01); *H10D 64/117* (2025.01)

(58) Field of Classification Search
CPC .. H10D 64/112; H10D 12/481; H10D 62/127; H10D 64/117; H10D 64/232
(Continued)

(56) References Cited

U.S. PATENT DOCUMENTS 10,186,606 B2 * 1/2019 Sumitomo ............. H10D 12/00
10,192,977 B2 1/2019 Furukawa et al.
(Continued)

FOREIGN PATENT DOCUMENTS

JP 2005-294649 A 10/2005
JP 2013-080796 A 5/2013
(Continued)

OTHER PUBLICATIONS

Office Action issued in Japanese Patent Application No. 2022-140947, dated Jun. 27, 2025 in 12 pages.

*Primary Examiner* — Mohammad M Hoque
(74) *Attorney, Agent, or Firm* — Knobbe, Martens, Olson & Bear, LLP

(57) ABSTRACT

A semiconductor device includes first and second electrodes, a semiconductor part, a structure body, and an insulating part. The semiconductor part includes first to fifth semiconductor regions. The structure body includes a gate part and a dummy part. The gate part includes at least one gate electrode. The dummy part includes at least two dummy electrodes. The gate part and the dummy part are alternately arranged. The insulating part is located between the gate electrode and the semiconductor part. The gate part is located in the fourth semiconductor region. A first potential is applied to the second electrode. A second potential that is greater than the first potential is applied to the gate electrode. A third potential that is greater than the first potential is applied to the dummy electrode located at a position next to the gate part.

17 Claims, 8 Drawing Sheets

(58) Field of Classification Search
USPC ......................................................... 257/139
See application file for complete search history.

(56) References Cited

U.S. PATENT DOCUMENTS

| | | | | |
|---|---|---|---|---|
| 10,840,364 B2* | 11/2020 | Yoneda | ................. | H10D 62/133 |
| 11,158,631 B2* | 10/2021 | Harada | .................. | H10D 8/422 |
| 11,222,966 B2* | 1/2022 | Kawamura | .......... | H10D 62/137 |
| 11,227,927 B2* | 1/2022 | Chen | ................... | H10D 12/038 |
| 11,264,491 B2* | 3/2022 | Ozaki | .................. | H10D 62/127 |
| 11,276,686 B2* | 3/2022 | Yoshida | .............. | H10D 62/145 |
| 11,393,919 B2* | 7/2022 | Nishi | ................... | H10D 62/393 |
| 12,087,849 B2* | 9/2024 | Harada | ................ | H10D 64/117 |
| 2004/0041171 A1* | 3/2004 | Ogura | .................. | H10D 62/106 |
| | | | | 257/E29.066 |
| 2009/0283797 A1* | 11/2009 | Takahashi | ............ | H10D 12/481 |
| | | | | 257/E29.198 |
| 2013/0037853 A1* | 2/2013 | Onozawa | ............ | H10D 64/231 |
| | | | | 257/E29.198 |
| 2017/0077274 A1* | 3/2017 | Naito | ................ | H01L 21/26586 |
| 2018/0204909 A1 | 7/2018 | Konishi et al. | | |
| 2018/0204910 A1 | 7/2018 | Mitamura | | |
| 2020/0203512 A1 | 6/2020 | Shirakawa | | |
| 2021/0234027 A1 | 7/2021 | Yoshida | | |
| 2021/0265491 A1 | 8/2021 | Soneda et al. | | |
| 2021/0296475 A1 | 9/2021 | Iwakaji et al. | | |
| 2021/0384335 A1 | 12/2021 | Sako et al. | | |
| 2022/0013634 A1 | 1/2022 | Nitta et al. | | |

FOREIGN PATENT DOCUMENTS

| | | | |
|---|---|---|---|
| JP | 2016-082167 A | 5/2016 | |
| JP | 2018-117025 A | 7/2018 | |
| JP | 2019-220722 A | 12/2019 | |
| JP | 2020-098881 A | 6/2020 | |
| JP | 2021-136311 A | 9/2021 | |
| JP | 2021-150542 A | 9/2021 | |
| JP | 2021-190657 A | 12/2021 | |
| JP | 2022-015861 A | 1/2022 | |
| WO | 2015-162811 | 10/2015 | |
| WO | 2020/213254 A1 | 10/2020 | |

* cited by examiner

1

INSULATED GATE BIPOLAR TRANSISTOR (IGBT) SEMICONDUCTOR DEVICE WITH REDUCED TURN-ON LOSS

CROSS-REFERENCE TO RELATED APPLICATIONS

This application is based upon and claims the benefit of priority from Japanese Patent Application No. 2022-047254, filed on Mar. 23, 2022, and No. 2022-140947, filed on Sep. 5, 2022; the entire contents of which are incorporated herein by reference.

FIELD

Embodiments described herein relate generally to a semiconductor device.

BACKGROUND

Semiconductor devices such as insulated gate bipolar transistors (IGBTs) and the like are used in applications such as power conversion and the like. In such a semiconductor device, it is desirable to reduce the loss at turn-on.

DETAILED DESCRIPTION

Figure 1:
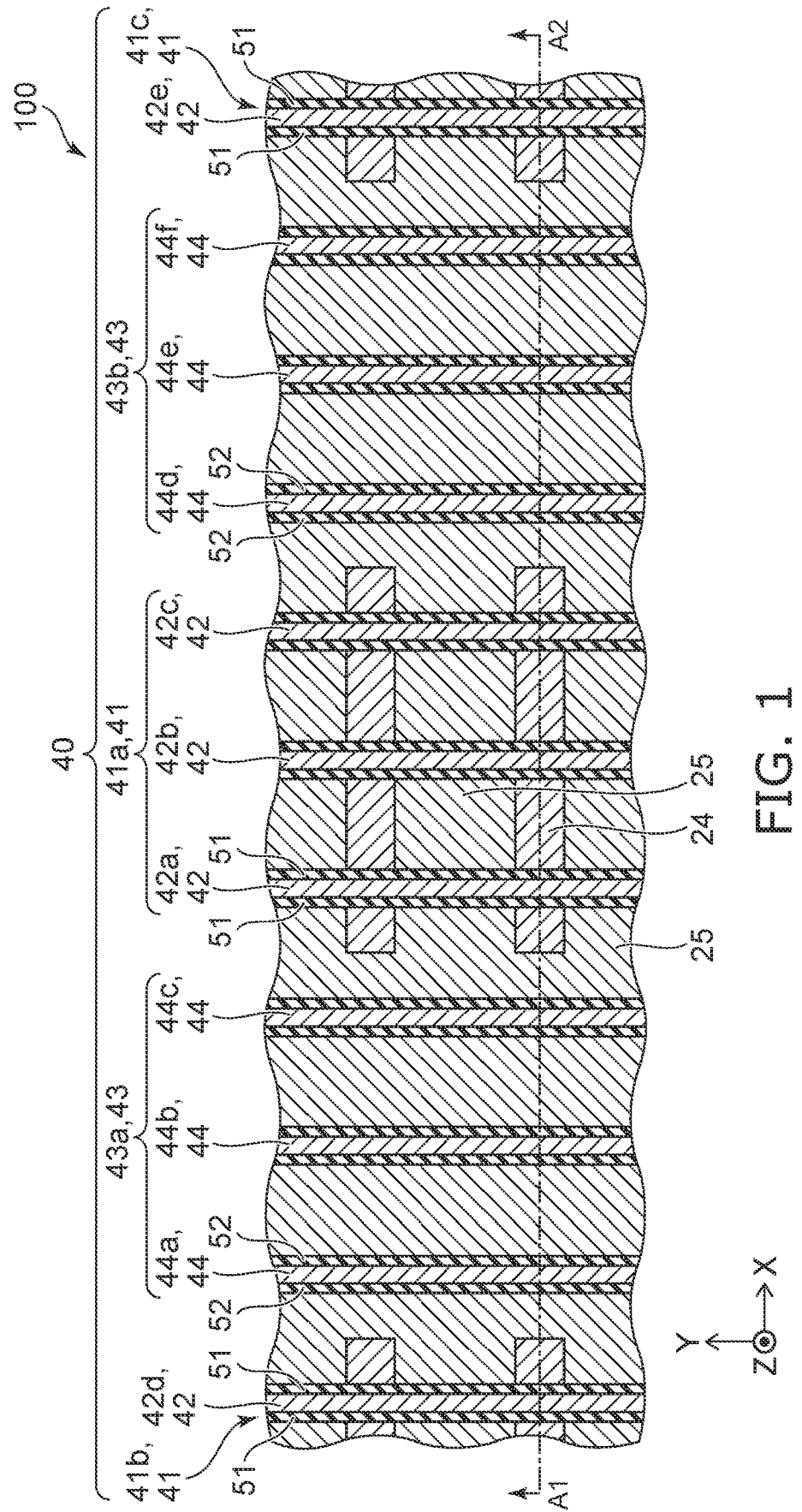
FIG. 1 is a plan view showing a semiconductor device according to a first embodiment.

A semiconductor device according to an embodiment includes a first electrode, a semiconductor part, a second electrode, a structure body, and an insulating part. The semiconductor part includes a first semiconductor region that is located on the first electrode and is of a p-type, a second semiconductor region that is located on the first semiconductor region and is of an n-type, a third semiconductor region that is located on the second semiconductor region and is of the p-type, a fourth semiconductor region that is located on the third semiconductor region and is of the n-type, and a fifth semiconductor region that is located on the third semiconductor region and is of the p-type. The second electrode is located on the semiconductor part. The structure body includes a gate part and a dummy part. The gate part includes at least one gate electrode. The dummy part includes at least two dummy electrodes. The gate part and the dummy part are alternately arranged in a second direction perpendicular to a first direction that is from the first semiconductor region toward the second semiconductor region. The insulating part is located between the gate electrode and the semiconductor part. The gate part is located in the fourth semiconductor region. A first potential is applied to the second electrode. A second potential that is greater than the first potential is applied to the gate electrode. A third potential that is greater than the first potential is applied to the dummy electrode located at a position next to the gate part.

Exemplary embodiments will now be described with reference to the drawings. The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. Furthermore, in the specification of the application and the drawings, components similar to those described in regard to a drawing thereinabove are marked with like reference numerals; and a detailed description is omitted as appropriate.

For easier understanding of the following description, the arrangements and configurations of the portions are described using an XYZ orthogonal coordinate system. An X-axis, a Y-axis, and a Z-axis are orthogonal to each other. The direction in which the X-axis extends is taken as an "X-direction"; the direction in which the Y-axis extends is taken as a "Y-direction"; and the direction in which the Z-axis extends is taken as a "Z-direction". Although the direction of the arrow in the Z-direction is taken as up and the opposite direction is taken as down for easier understanding of the description, these directions are independent of the direction of gravity.

Hereinbelow, the notations of + and − indicate relative levels of the impurity concentrations of each conductivity type. Specifically, a notation marked with "+" indicates a higher impurity concentration than a notation not marked with either "+" or "−". A notation marked with "−" indicates a lower impurity concentration than a notation not marked with either "+" or "−". Here, when both an impurity that forms donors and an impurity that forms acceptors are included in each region, the "impurity concentration" means the net impurity concentration after the impurities cancel.

Figure 2:
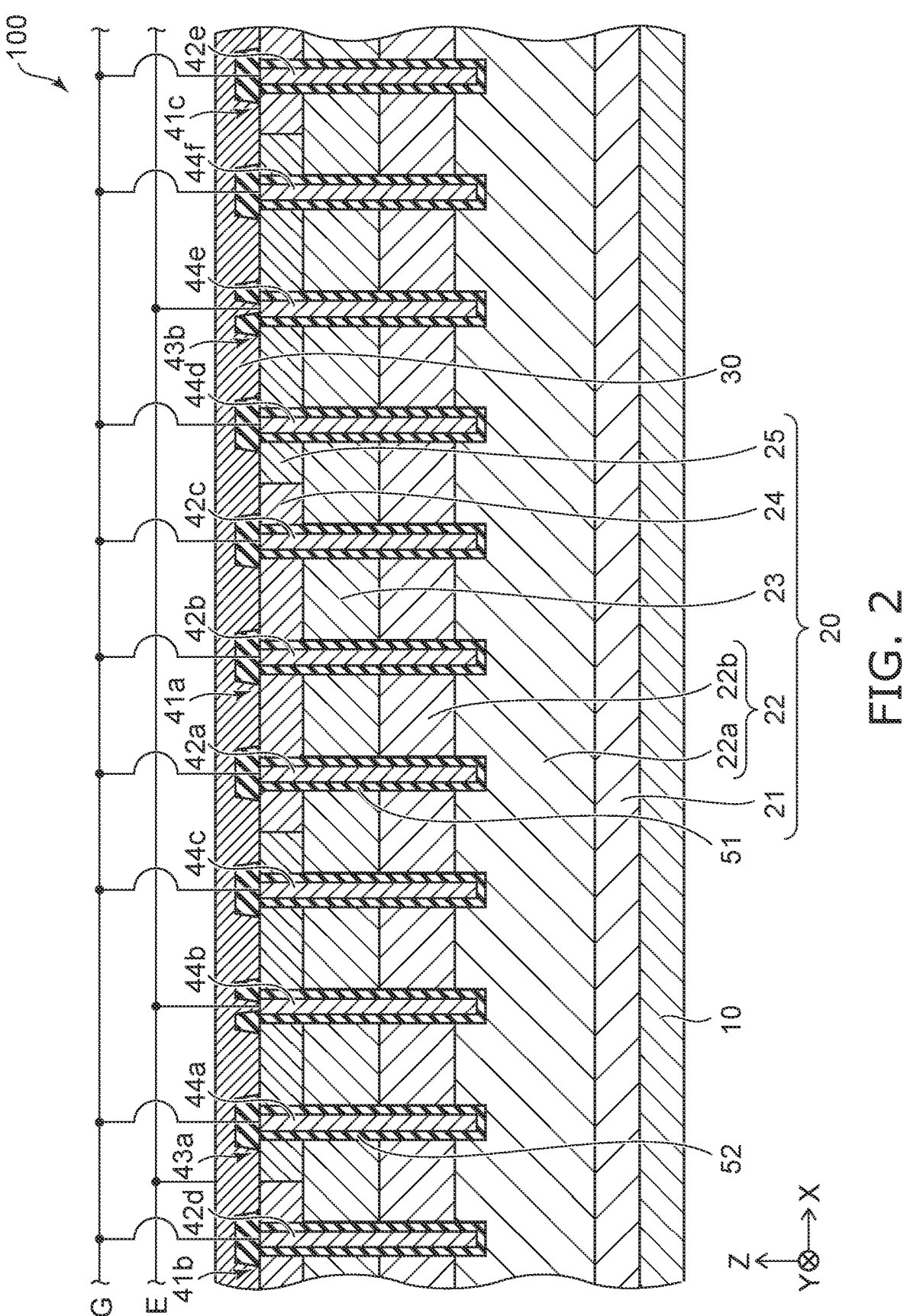
FIG. 2 is a cross-sectional view showing the semiconductor device according to the first embodiment.

FIG. 1 is a plan view showing a sea semiconductor device according to a first embodiment, FIG. 2 is a cross-sectional view showing the semiconductor device according to the first embodiment.

FIG. 2 is a cross-sectional view along line A1-A2 shown in FIG. 1.

As illustrated in FIGS. 1 and 2, the semiconductor device 100 according to the first embodiment includes a first electrode 10, a semiconductor part 20, a second electrode 30, a structure body 40, a first insulating part 51, and a second insulating part 52. The semiconductor device 100 is an IGBT.

The first electrode 10 is located in the lower part of the semiconductor device 100. The first electrode 10 is a lower electrode. For example, the first electrode 10 functions as a collector electrode. The upper surface and the lower surface of the first electrode 10 are substantially parallel to the XY plane. The first electrode 10 is made of a conductive material such as a metal material, etc.

The semiconductor part 20 includes a first semiconductor region 21, a second semiconductor region 22, a third semiconductor region 23, a fourth semiconductor region 24, and a fifth semiconductor region 25.

The first semiconductor region 21 is located on the first electrode 10. The first semiconductor region 21 is a p-type semiconductor region. The first semiconductor region 21 is a p$^+$-semiconductor region. The impurity concentration of the first semiconductor region 21 is, for example, greater than the impurity concentration of the third semiconductor region 23.

The second semiconductor region 22 is located on the first semiconductor region 21. The second semiconductor region 22 is an n-type semiconductor region. The second semiconductor region 22 includes a first layer 22a and a second layer 22b. The first layer 22a is located on the first semiconductor region 21. The second layer 22b is located on the first layer 22a. The first layer 22a is an n$^-$-semiconductor region. The impurity concentration of the first layer 22a is, for example, less than the impurity concentration of the second layer 22b.

The third semiconductor region 23 is located on the second semiconductor region 22. The third semiconductor region 23 is located on the second layer 22b. The third semiconductor region 23 is a p-type semiconductor region.

The fourth semiconductor region 24 is located on the third semiconductor region 23. The fourth semiconductor region 24 is an n-type semiconductor region. The fourth semiconductor region 24 is an n$^+$-semiconductor region. The impurity concentration of the fourth semiconductor region 24 is, for example, greater than the impurity concentration of the second layer 22b of the second semiconductor region 22.

The fifth semiconductor region 25 is located on the third semiconductor region 23. The fifth semiconductor region 25 is a p-type semiconductor region. The fifth semiconductor region 25 is a p$^+$-semiconductor region. The impurity concentration of the fifth semiconductor region 25 is, for example, greater than the impurity concentration of the third semiconductor region 23.

A first direction from the first semiconductor region 21 toward the second semiconductor region 22 is along a Z-direction. A second direction perpendicular to the first direction is along an X-direction. In the example, the fourth semiconductor region 24 and the fifth semiconductor region 25 are alternately arranged in the X-direction. In the example, the fourth semiconductor region 24 and the fifth semiconductor region 25 are alternately arranged in a Y-direction.

The first semiconductor region 21, the second semiconductor region 22, the third semiconductor region 23, the fourth semiconductor region 24, and the fifth semiconductor region 25 include, for example, a semiconductor material such as silicon, etc., and impurities that correspond to each region.

The structure body 40 is located inside the semiconductor part 20. The structure body 40 has a structure in which a gate part 41 and a dummy part 43 are alternately arranged in the X-direction. In other words, the structure body 40 includes multiple gate parts 41 and multiple dummy parts 43, The gate parts 41 and the dummy parts 43 are alternately arranged in the X-direction. The gate parts 41 and the dummy parts 43 each extend in the Y-direction.

The gate part 41 is located in the fourth semiconductor region 24, The gate part 41 includes at least one gate electrode 42. In the example, the gate part 41 includes three gate electrodes 42. In the example, the gate part 41 is made of the three gate electrodes 42.

The gate electrode 42 extends in the Z-direction from the upper end of the fourth semiconductor region 24 via the third semiconductor region 23 and the second layer 22b of the second semiconductor region 22 to the first layer 22a of the second semiconductor region 22, In other words, the gate electrode 42 is arranged with the fourth semiconductor region 24, the third semiconductor region 23, the second layer 22b of the second semiconductor region 22, and the first layer 22a of the second semiconductor region 22 in the X-direction. For example, the gate electrode 42 is made of a conductive material such as a metal material, polysilicon, etc.

The first insulating part 51 is located between the gate electrode 42 and the semiconductor part 20. In the X-direction, a portion of the first insulating part 51 is positioned between the gate electrode 42 and the fourth semiconductor region 24, between the gate electrode 42 and the third semiconductor region 23, between the gate electrode 42 and the second layer 22b of the second semiconductor region 22, and between the gate electrode 42 and the first layer 22a of the second semiconductor region 22. In the Z-direction, another portion of the first insulating part 51 is positioned between the gate electrode 42 and the first layer 22a of the second semiconductor region 22, For example, a portion of the first insulating part 51 functions as a gate insulating film. For example, the first insulating part 51 is made of an insulating material such as silicon oxide, silicon nitride, etc.

In the example, the dummy part 43 is located in the fifth semiconductor region 25. The dummy part 43 includes at least two dummy electrodes 44. In the example, the dummy part 43 includes three dummy electrodes 44. In the example, the dummy part 43 is made of the three dummy electrodes 44.

The dummy electrode 44 extends in the Z-direction from the upper end of the fifth semiconductor region 25 via the third semiconductor region 23 and the second layer 22b of the second semiconductor region 22 to the first layer 22a of the second semiconductor region 22. In other words, in the X-direction, the dummy electrode 44 is arranged with the fifth semiconductor region 25, the third semiconductor region 23, the second layer 22b of the second semiconductor region 22, and the first layer 22a of the second semiconductor region 22. For example, the lower end of the dummy electrode 44 is arranged with the lower end of the gate electrode 42 in the X-direction. For example, the dummy electrode 44 is made of a conductive material, etc., such as a metal material, polysilicon, etc.

The second insulating part 52 is located between the dummy electrode 44 and the semiconductor part 20. In the X-direction, a portion of the second insulating part 52 is positioned between the dummy electrode 44 and the fifth semiconductor region 25, between the dummy electrode 44 and the third semiconductor region 23, between the dummy electrode 44 and the second layer 22b of the second semiconductor region 22, and between the dummy electrode 44 and the first layer 22a of the second semiconductor region 22. In the Z-direction, another portion of the second insulating part 52 is positioned between the dummy electrode 44 and the first layer 22a of the second semiconductor region 22. For example, the second insulating part 52 is made of an insulating material such as silicon oxide, silicon nitride, etc.

In the example, the structure body 40 includes gate parts 41a, 41b, and 41c and dummy parts 43a and 43b. These parts are arranged in the order of the gate part 41b, the dummy part 43a, the gate part 41a, the dummy part 43b, and the gate part 41c in the X-direction.

The gate part 41a includes gate electrodes 42a, 42b, and 42c. The gate part 41b includes a gate electrode 42d and two not-illustrated gate electrodes 42. The gate part 41c includes a gate electrode 42e and two not-illustrated gate electrodes 42. The dummy part 43a includes dummy electrodes 44a, 44b, and 44c. The dummy part 43b includes dummy electrodes 44d, 44e, and 44f.

The second electrode 30 is located on the semiconductor part 20. The second electrode 30 is located on the fourth semiconductor region 24 and on the fifth semiconductor region 25. The second electrode 30 is an upper electrode. For example, the second electrode 30 functions as an emitter electrode. The second electrode 30 is made of a conductive material such as a metal material, etc. The second electrode 30 is not illustrated in FIG. 1, An insulating part is located between the second electrode 30 and the gate electrode 42.

A first potential is applied to the second electrode 30, The first potential is, for example, an emitter potential E. The first potential is, for example, 0 V.

A second potential is applied to the gate electrode 42. The second potential is, for example, a gate potential G. The second potential is greater than the first potential. The second potential is, for example, 15 V.

A third potential is applied to the dummy electrode 44 among the dummy electrodes 44 located at a position next to the gate part 41. The third potential is greater than the first potential. In the example, the third potential is applied to the dummy electrode 44a located at a position next to the gate part 41b, the dummy electrodes 44c and 44d located at positions next to the gate part 41a, and the dummy electrode 44f located at a position next to the gate part 41c.

The third potential is, for example, greater than the first potential and not more than the second potential. The third potential is, for example, equal to the second potential. The third potential is, for example, greater than 0 V and not more than 15 V. The third potential is, for example, 15 V. In other words, among the dummy electrodes 44, for example, the gate potential G is applied to the dummy electrode 44 located at a position next to the gate part 41. In other words, among the dummy electrodes 44, the dummy electrode 44 that is located at the position next to the gate part 41 is connected to, for example, the gate electrode 42. Among the dummy electrode 44, the dummy electrode 44 that is located at the position next to the gate part 41 is connected with, for example, the gate electrode 42 at the Y-direction end part of the semiconductor device 100.

On the other hand, among the dummy electrodes 44, for example, the first potential is applied to the dummy electrode 44 that is located at a position not next to the gate part 41. In the example, the first potential is applied to the dummy electrodes 44b and 44e located at positions not next to the gate part 41. In other words, among the dummy electrodes 44, for example, the emitter potential E is applied to the dummy electrodes 44 located at positions not next to the gate part 41. In other words, among the dummy electrodes 44, the dummy electrodes 44 located at positions not next to the gate part 41 are connected to, for example, the second electrode 30.

Operations and effects of the semiconductor device 100 will now be described.

The semiconductor device is set to the on-state when a voltage that is not less than a threshold is applied to the gate electrode 42 in a state in which a positive voltage with respect to the second electrode 30 (an emitter electrode) is applied to the first electrode 10 (a collector electrode). At this time, a channel (an inversion layer) is formed in the region of the third semiconductor region 23 at the first insulating part 51 (gate insulating film) vicinity. Electrons are injected from the fourth semiconductor region 24 via the channel into the second semiconductor region 22; and holes are injected from the first semiconductor region 21 into the second semiconductor region 22. Subsequently, when the voltage applied to the gate electrode 42 drops below the threshold, the channel in the third semiconductor region 23 disappears, and the semiconductor device is set to the off-state.

The capacitance of the gate electrode 42 can be reduced by providing the structure body 40 in which the gate part 41 including the gate electrode 42 and the dummy part 43 including the dummy electrode 44 are alternately arranged inside the semiconductor part 20, and by applying the first potential (the emitter potential E) to the dummy electrode 44. The response speed can be increased thereby.

On the other hand, when the first potential is applied to the dummy electrode 44 located at the position next to the gate part 41, the hole current is undesirably discharged by the hole inversion layer at turn-on, and the hole accumulation rate is easily reduced.

In contrast, in the semiconductor device 100 according to the first embodiment, by applying the third potential that is greater than the first potential to the dummy electrode 44 located at the position next to the gate part 41, the hole accumulation rate can be ensured, and the fall characteristic of a collector-emitter voltage Vce at turn-on can be improved. The loss at turn-on can be reduced thereby.

By setting the third potential applied to the dummy electrode 44 located at the position next to the gate part 41 equal to the second potential (the gate potential G) applied to the gate electrode 42, the loss at turn-on can be further reduced. For example, by connecting the dummy electrode 44 located at the position next to the gate part 41 to the gate electrode 42, the third potential can be equal to the second potential.

The response speed can be increased by applying the first potential to the dummy electrode 44 located at the position not next to the gate part 41. For example, by connecting the dummy electrode 44 located at the position not next to the gate part 41 to the second electrode 30, the first potential can be applied to the dummy electrode 44 located at the position not next to the gate part 41.

By the gate part 41 including the three gate electrodes 42 and by the dummy part 43 including the three dummy electrodes 44, the increase of the response speed and the improvement of the on-voltage and/or on-resistance can be achieved with better balance.

Figure 3A:
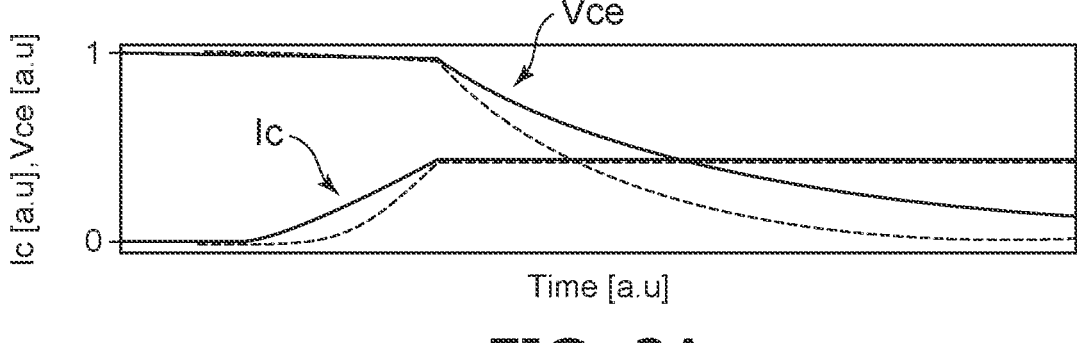
FIGS. 3A and 3B are graphs showing simulation results of characteristics of the semiconductor device according to the first embodiment.
Figure 3B:
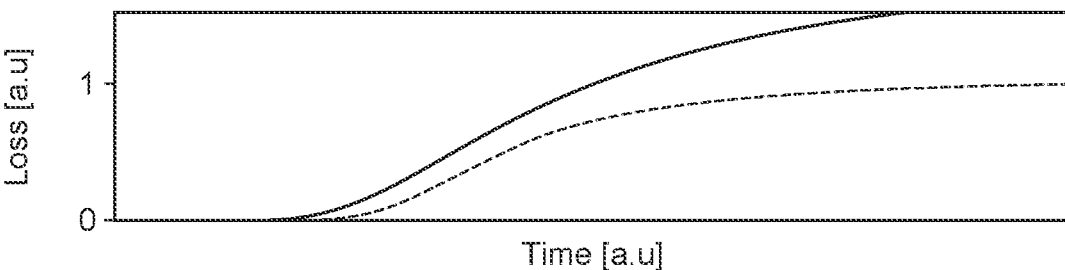

FIGS. 3A and 3B are graphs showing simulation results of characteristics of the semiconductor device according to the first embodiment.

In FIGS. 3A and 3B, the horizontal axis is the time (a. u.). In FIG. 3A, the vertical axis is a collector-emitter current Ic (a. u.) and the collector-emitter voltage Vce (a. u.). In FIG. 3B, the vertical axis is the loss (a. u.). "a. u." means arbitrary units.

FIGS. 3A and 3B show simulation results of the characteristics of an experimental example 1 having a structure in which the gate part 41 including the three gate electrodes 42 and the dummy part 43 including the three dummy electrodes 44 were alternately arranged and the gate potential was applied to the dummy electrode 44 located at the position next to the gate part 41, and an experimental example 2 in which the emitter potential was applied to the dummy electrode 44 located at the position next to the gate part 41.

A gate potential was applied to the gate electrode 42 in the experimental examples 1 and 2. In the experimental examples 1 and 2, the gate potential was set to 15 V, and the emitter potential was set to 0 V.

In FIG. 3A, the change over time of the collector-emitter current Ic and the collector-emitter voltage Vce at turn-on of the experimental example 1 are shown by broken lines, and the change over time of the collector-emitter current Ic and the collector-emitter voltage Vce at turn-on of the experimental example 2 are shown by solid lines.

In FIG. 3B, the change over time of the loss at turn-on of the experimental example 1 is shown by a broken line, and the change over time of the loss at turn-on of the experimental example 2 is shown by a solid line.

In the experimental example 1 as illustrated in FIGS. 3A and 3B, compared to the experimental example 2, the fall characteristic of the collector-emitter voltage Vce at turn-on was good, and the loss at turn-on was reduced.

Therefore, this suggests that according to the first embodiment, compared to when the first potential (e.g., the emitter potential) is applied to the dummy electrode 44 located at the position next to the gate part 41, the loss at turn-on can be reduced by applying the third potential (e.g., the gate potential) that is greater than the first potential to the dummy electrode 44 located at the position next to the gate part 41.

Figure 4:
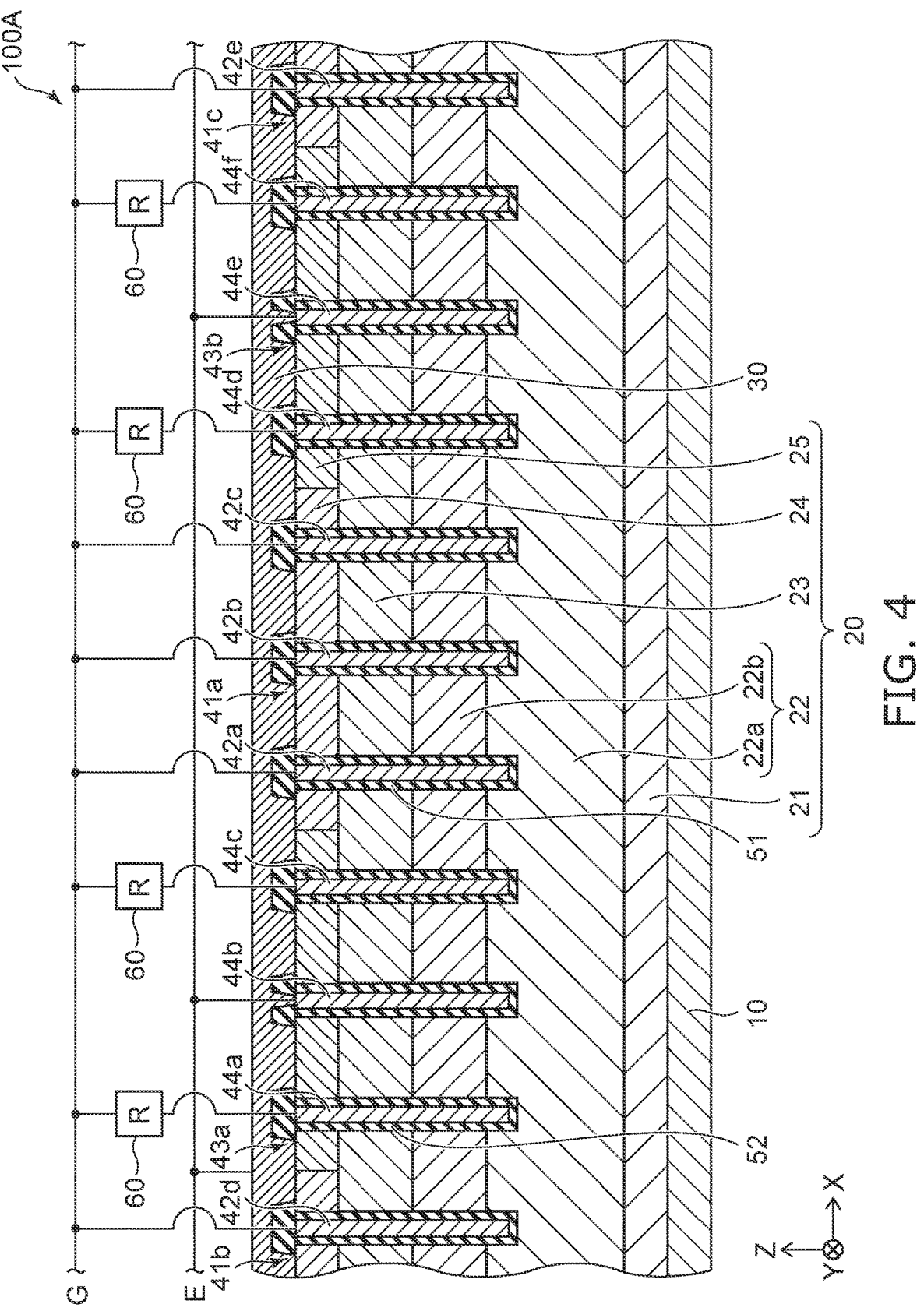
FIG. 4 is a cross-sectional view showing a semiconductor device according to a first modification of the first embodiment.

FIG. 4 is a cross-sectional view showing a semiconductor device according to a first modification of the first embodiment.

In the semiconductor device 100A according to the first modification of the first embodiment as illustrated in FIG. 4, among the dummy electrodes 44, a resistance part 60 is provided between the gate potential G and the dummy electrode 44 located at the position next to the gate part 41. Otherwise, the semiconductor device 100A is substantially the same as the semiconductor device 100 described above.

More specifically, the resistance part 60 is provided between the gate potential G and the dummy electrodes 44a, 44c, 44d, and 44f. Thereby, the third potential that is applied to the dummy electrodes 44a, 44c, 44d, and 44f is less than the second potential (the gate potential G). Thus, the third potential may be adjusted by providing the resistance part 60, etc.

In the semiconductor device 100A according to the first modification of the first embodiment as well, by applying the third potential that is greater than the first potential to the dummy electrode 44 located at the position next to the gate part 41, the hole accumulation rate can be ensured, and the fall characteristic of the collector-emitter voltage Vce at turn-on can be improved. The loss at turn-on can be reduced thereby.

Figure 5:
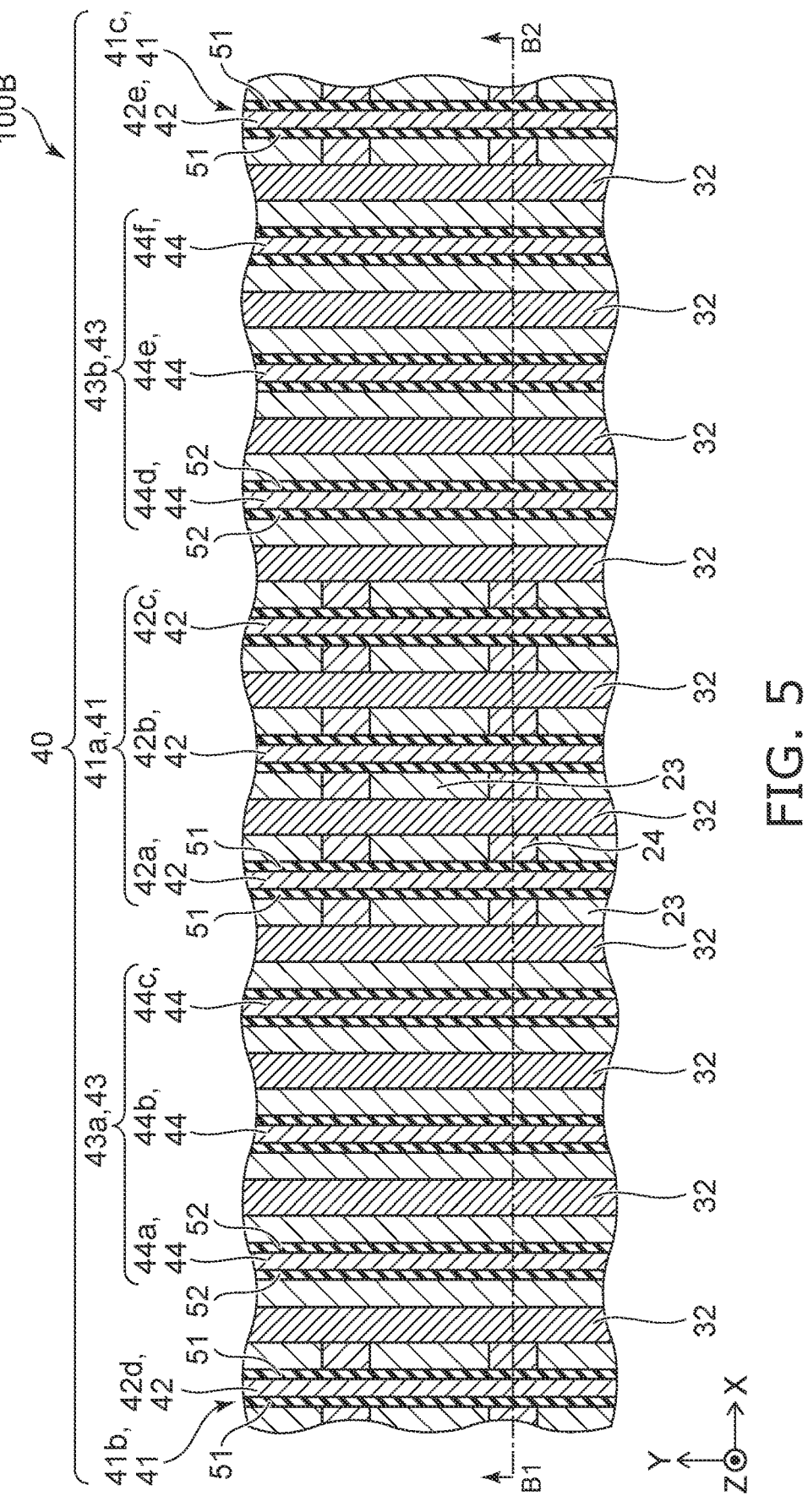
FIG. 5 is a plan view showing a semiconductor device according to a second modification of the first embodiment.

FIG. 5 is a plan view showing a semiconductor device according to a second modification of the first embodiment.

Figure 6:
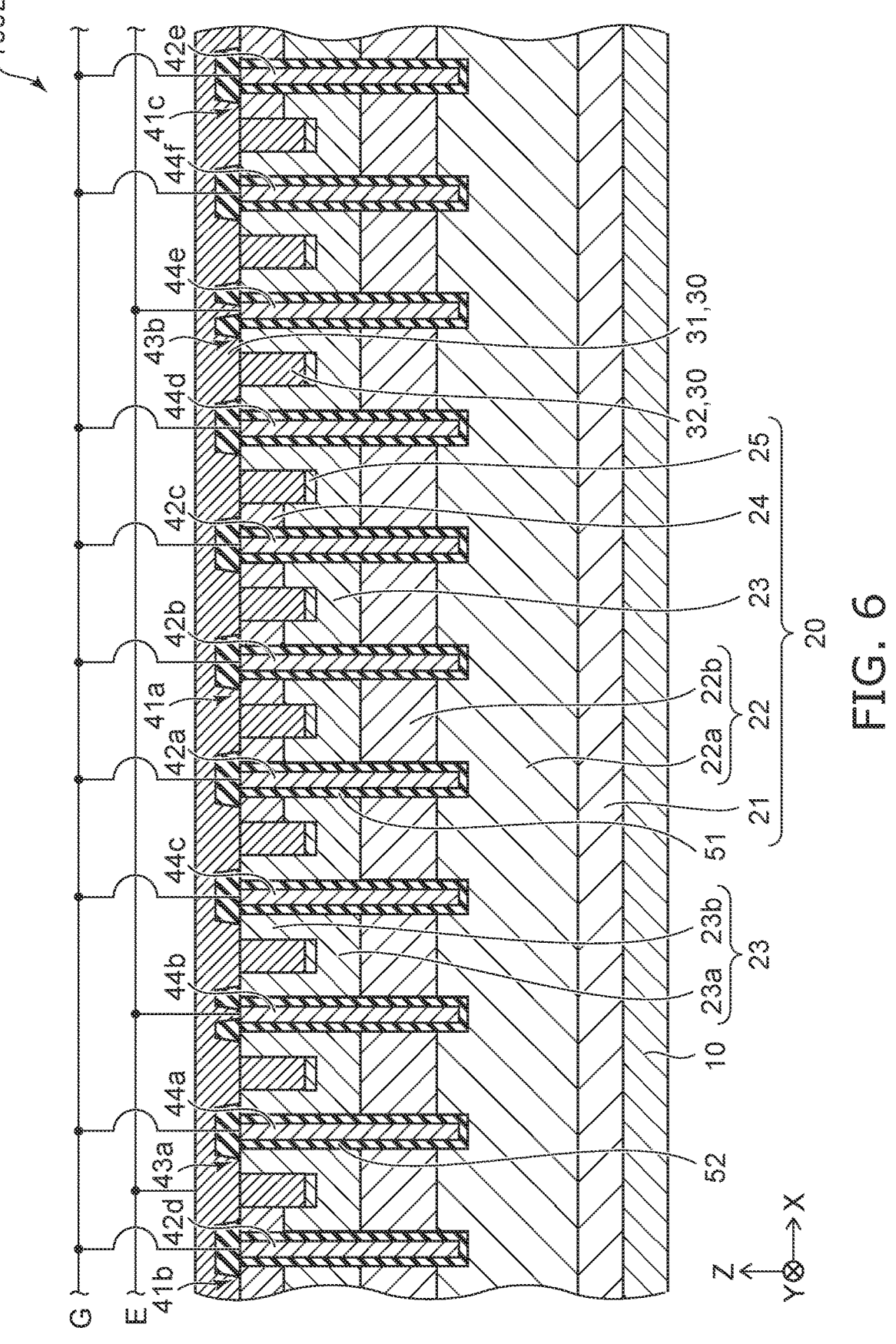
FIG. 6 is a cross-sectional view showing the semiconductor device according to the second modification of the first embodiment.

FIG. 6 is a cross-sectional view showing the semiconductor device according to the second modification of the first embodiment.

FIG. 6 is a cross-sectional view along line B1-B2 shown in FIG. 5.

In the semiconductor device 100B according to the second modification of the first embodiment as illustrated in FIGS. 5 and 6, the second electrode 30 includes a first conductive part 31 and a second conductive part 32. The first conductive part 31 is not illustrated in FIG. 5.

The first conductive part 31 is located on the semiconductor part 20. The second conductive part 32 is located under the first conductive part 31, The second conductive part 32 is located in the semiconductor part 20. At least a portion of the second conductive part 32 is positioned between two gate electrodes 42 next to each other in the X-direction. In the example, the second conductive part 32 is located between the two gate electrodes 42 next to each other, between the two dummy electrodes 44 next to each other, and between the gate electrode 42 and the dummy electrode 44 next to each other.

In the example, the third semiconductor region 23 includes a first part 23a and a second part 23b. The second part 23b is located on the first part 23a, The fourth semiconductor region 24 is located on the first part 23a. In the example, the fourth semiconductor region 24 and the second part 23b of the third semiconductor region 23 are alternately arranged in the X-direction along line B1-B2. In the example, the fourth semiconductor region 24 and the second part 23b of the third semiconductor region 23 are alternately arranged in the Y-direction at the side surface of the gate electrode 42, In the example, the dummy part 43 is located in the second part 23b of the third semiconductor region 23.

In the example, the fifth semiconductor region 25 is located under the second conductive part 32. The fifth semiconductor region 25 is located between the second conductive part 32 and the first part 23a of the third semiconductor region 23 in the Z-direction. The fifth semiconductor region 25 is arranged with the first part 23a of the third semiconductor region 23 in the X-direction. Otherwise, the example is substantially the same as the semiconductor device 100 described above.

The second conductive part 32 that is located between two mutually-adjacent gate electrodes 42 is located in the fourth semiconductor region 24. The second conductive part 32 that is located between the two mutually-adjacent gate electrodes 42 extends in the Z-direction from the lower end of the first conductive part 31 through the fourth semiconductor region 24 to the first part 23a of the third semiconductor region 23. In other words, the second conductive part 32 that is located between the two mutually-adjacent gate electrodes 42 is arranged with the fourth semiconductor region 24 and the first part 23a of the third semiconductor region 23 in the X-direction.

The second conductive part 32 that is located between the two mutually-adjacent dummy electrodes 44 is located in the second part 23b of the third semiconductor region 23. The second conductive part 32 that is located between the two mutually-adjacent dummy electrodes 44 extends in the Z-direction from the lower end of the first conductive part 31 through the second part 23b of the third semiconductor region 23 to the first part 23a of the third semiconductor region 23. In other words, the second conductive part 32 that is located between the two mutually-adjacent dummy electrodes 44 is arranged with the first and second parts 23a and 23b of the third semiconductor region 23 in the X-direction.

The second conductive part 32 that is located between the gate electrode 42 and the dummy electrode 44 that are next to each other is located at the boundary between the fourth semiconductor region 24 and the second part 23b of the third semiconductor region 23, The second conductive part 32 that is located between the gate electrode 42 and the dummy electrode 44 that are next to each other extends in the Z-direction from the lower end of the first conductive part 31 through the second part 23b of the third semiconductor region 23 and the fourth semiconductor region 24 to the first part 23a of the third semiconductor region 23. In other words, the second conductive part 32 that is located between the gate electrode 42 and the dummy electrode 44 that are next to each other is arranged with the fourth semiconductor region 24 and the first and second parts 23a and 23b of the third semiconductor region 23 in the X-direction.

In the semiconductor device 100B according to the second modification of the first embodiment as well, by applying the third potential that is greater than the first potential to the dummy electrode 44 located at the position next to the gate part 41, the hole accumulation rate can be ensured, and the fall characteristic of the collector-emitter voltage Vce at turn-on can be improved. The loss at turn-on can be reduced thereby.

Figure 7:
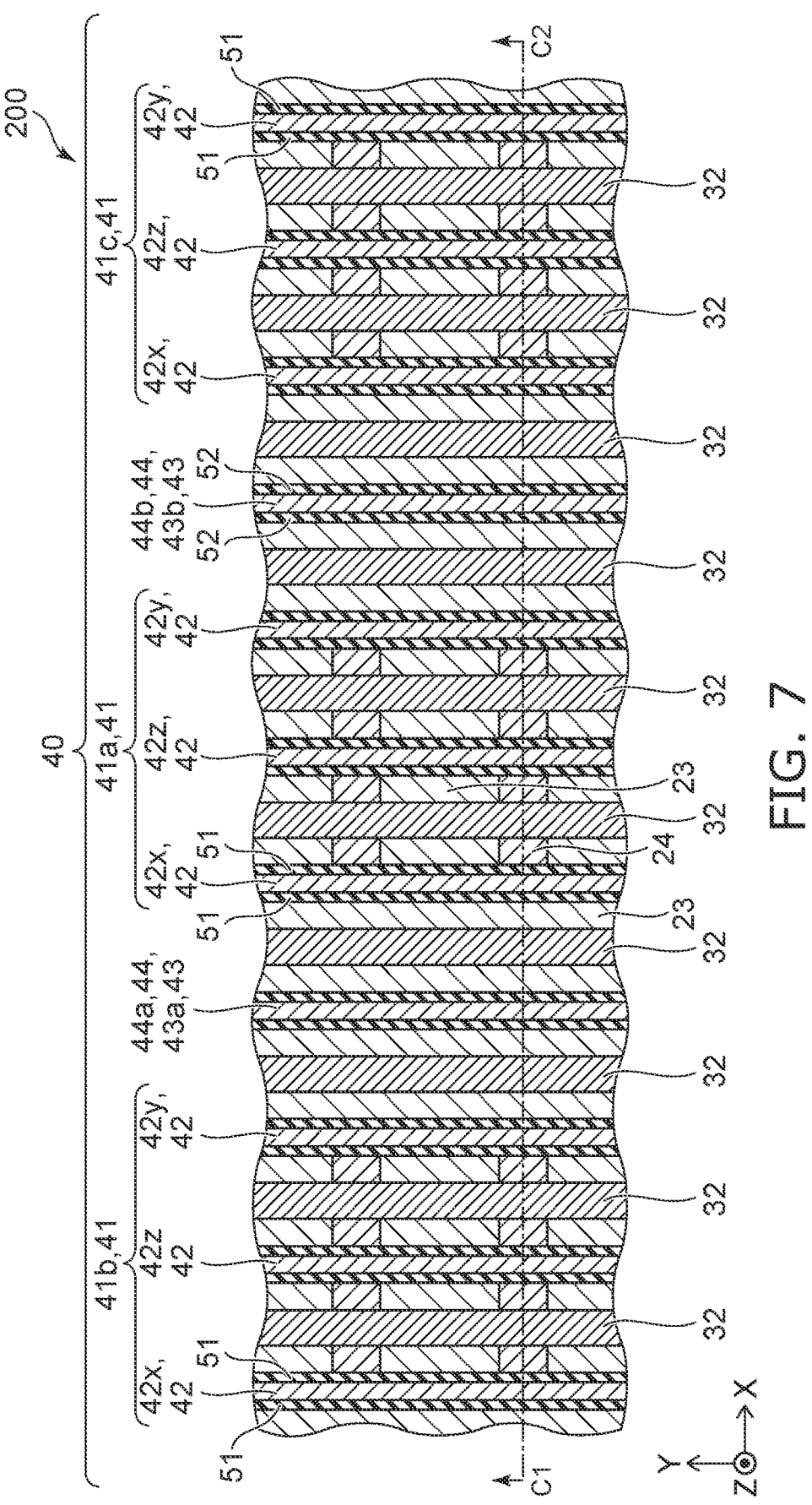
FIG. 7 is a plan view showing a semiconductor device according to a second embodiment.

FIG. 7 is a plan view showing a semiconductor device according to a second embodiment.

Figure 8:
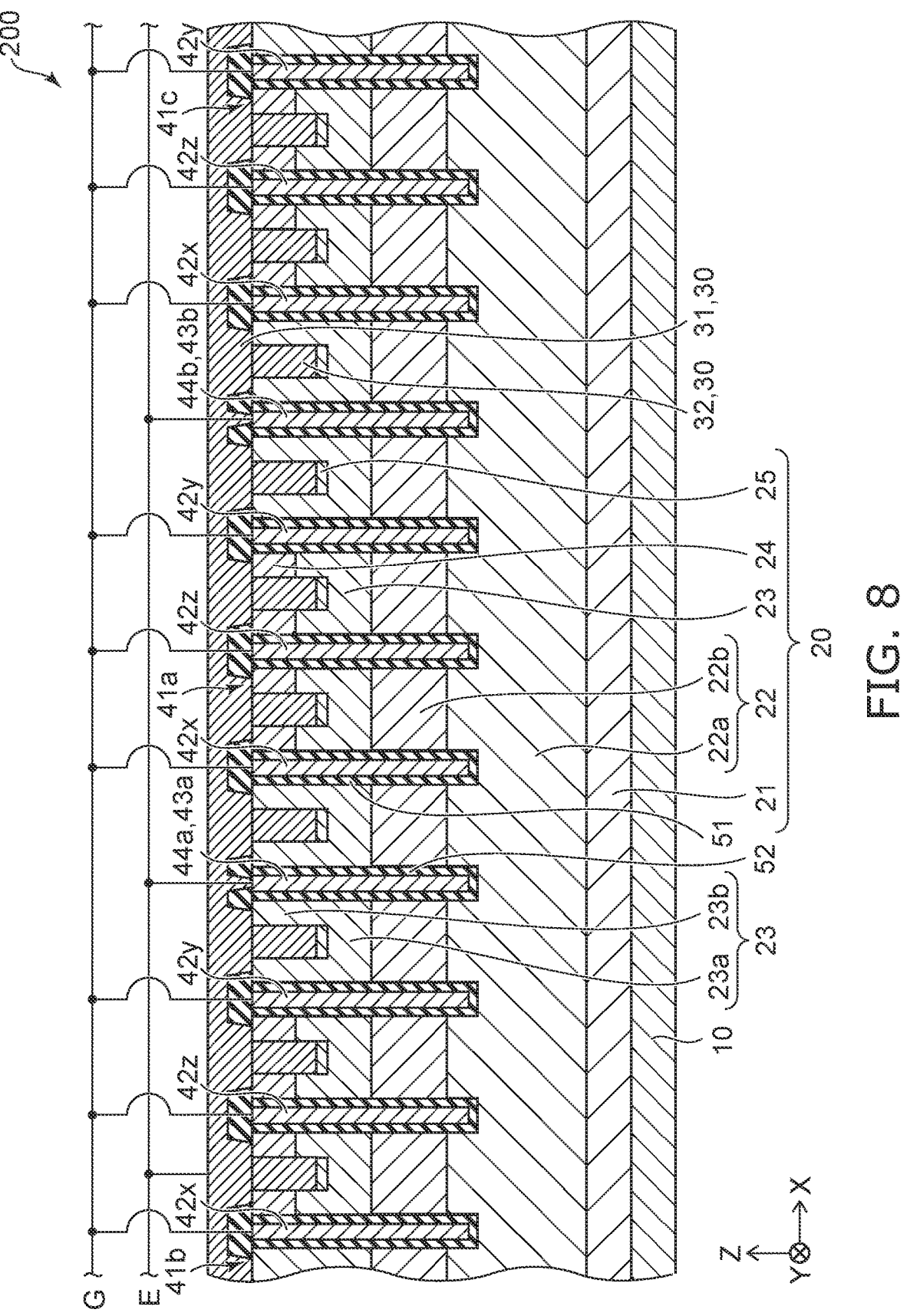
FIG. 8 is a cross-sectional view showing the semiconductor device according to the second embodiment.

FIG. 8 is a cross-sectional view showing the semiconductor device according to the second embodiment.

FIG. 8 is a cross-sectional view along line C1-C2 shown in FIG. 7.

In the semiconductor device 200 according to the second embodiment as illustrated in FIGS. 7 and 8, the gate part 41 includes at least two gate electrodes 42. In the semiconductor device 200, the dummy part 43 includes at least one dummy electrode 44. Otherwise, the semiconductor device 200 is substantially the same as the semiconductor device 1003 described above. The first conductive part 31 is not illustrated in FIG. 7.

More specifically, the gate part 41 includes at least a first gate electrode 42x and a second gate electrode 42y. The first gate electrode 42x is located at one end of the fourth semiconductor region 24 in the X-direction. The second gate electrode 42y is located at the other end of the fourth semiconductor region 24 in the X-direction. The first gate electrode 42x is positioned between the fourth semiconductor region 24 and the second part 23b of the third semiconductor region 23 in the X-direction. The second gate electrode 42y is positioned between the fourth semiconductor region 24 and the second part 23b of the third semiconductor region 23 in the X-direction. The fourth semiconductor region 24 is located between the first gate electrode 42x and the second gate electrode 42y in the X-direction.

In the X-direction, the second part 23b of the third semiconductor region 23 is located between one gate part 41 (e.g., the gate part 41a) and another gate part 41 (e.g., the gate part 41b or the gate part 41c) next to the one gate part 41. One X-direction side surface of the first gate electrode 42x faces the second part 23b of the third semiconductor region 23. The other X-direction side surface of the first gate electrode 42x faces the fourth semiconductor region 24. One X-direction side surface of the second gate electrode 42y faces the fourth semiconductor region 24. The other X-direction side surface of the second gate electrode 42y faces the second part 23b of the third semiconductor region 23.

The gate part 41 may further include a third gate electrode 42z located between the first gate electrode 42x and the second gate electrode 42y. The third gate electrode 42z is located in the fourth semiconductor region 24. In the example, the gate part 41 includes one third gate electrode 42z. That is, in the example, the gate part 41 is made of three gate electrodes 42. The number of the third gate electrodes 42z included in the gate part 41 may be zero, one, two, or more.

In the example, the dummy part 43 includes one dummy electrode 44. In the example, the dummy part 43 is made of one dummy electrode 44, That is, in the example, the number of the dummy electrodes 44 included in the dummy part 43 is one. The number of the dummy electrodes 44 included in the dummy part 43 may be one, two, or more.

In the example, the structure body 40 includes the gate parts 41a, 41b, and 41c and the dummy parts 43a and 43b. These parts are arranged in the order of the gate part 41b, the dummy part 43a, the gate part 41a, the dummy part 43b, and the gate part 41c in the X-direction.

The gate parts 41a, 41b, and 41c each include the first gate electrode 42x, the second gate electrode 42y, and the third gate electrode 42z. The dummy part 43a includes the dummy electrode 44a. The dummy part 43b includes the dummy electrode 44b.

In the example, the first potential is applied to the second electrode 30 and the dummy electrode 44. The first potential is, for example, the emitter potential E. The first potential is, for example, 0 V, On the other hand, the second potential is applied to the gate electrode 42. The second potential is, for example, the gate potential G. The second potential is greater than the first potential. The second potential is, for example, 15 V.

Operations and effects of the semiconductor device 200 will now be described.

The semiconductor device is set to the on-state when a voltage that is not less than a threshold is applied to the gate electrode 42 in a state in which a positive voltage with respect to the second electrode 30 (the emitter electrode) is applied to the first electrode 10 (the collector electrode). At this time, a channel (an inversion layer) is formed in the region of the third semiconductor region 23 at the first insulating part 51 (gate insulating film) vicinity. Electrons are injected from the fourth semiconductor region 24 via the channel into the second semiconductor region 22; and holes are injected from the first semiconductor region 21 into the second semiconductor region 22. Subsequently, when the voltage applied to the gate electrode 42 drops below the threshold, the channel in the third semiconductor region 23 disappears, and the semiconductor device is set to the off-state.

The capacitance of the gate electrode 42 can be reduced by providing the structure body 40, in which the gate part 41 including the gate electrode 42 and the dummy part 43 including the dummy electrode 44 are alternately arranged inside the semiconductor part 20, and by the gate part 41 including the first gate electrode 42x located at one end of the fourth semiconductor region 24 and the second gate electrode 42y located at the other end of the fourth semiconductor region 24. The response speed can be increased thereby. Also, the hole accumulation rate can be ensured, and the fall characteristic of the collector-emitter voltage Vce at turn-on can be improved. The loss at turn-on can be reduced thereby. The simulation results of the characteristics of the semiconductor device according to the second embodiment are similar to the simulation results of the characteristics of the semiconductor device according to the first embodiment illustrated in FIGS. 3A and 3B above.

If the number of the dummy electrodes 44 included in the dummy part 43 is one, compared to, for example, the second modification of the first embodiment, the gate capacitance can be reduced, and the drive loss can be reduced. When the gate potential G is applied to all of the dummy electrodes 44 without providing the dummy electrode 44 to which the emitter potential E is applied, a negative capacitance (a phenomenon of the gate charge decreasing when the gate potential G is increased) occurs when a load short circuit occurs, etc., and gate oscillation easily occurs. In contrast, the gate oscillation can be suppressed by providing the dummy electrode 44 to which the emitter potential E is applied. In the example, the surface area ratio of the fourth semiconductor region 24 supplying the electron current when switched on is equal to that of the second modification of the first embodiment shown in FIGS. 5 and 6. However, because the number of electrodes to which the gate potential G is applied is low, the gate capacitance is small, and the drive loss is small. Also, the gate driver that drives the IGBT can be made smaller. The example of FIG. 8 has the advantage that the negative capacitance occurs less easily because the number of successive adjacent electrodes to which the adjacent gate potential G is applied is three, which is less than the five of the example of FIG. 6. However, other than the load of the gate driver, it is not always better for the gate capacitance to be small depending on the application; it is therefore favorable to selectively use the structure of the second embodiment and structures such as that of the first embodiment.

Embodiments may include the following configurations.

Configuration 1

A semiconductor device, comprising:

a first electrode;

a semiconductor part including a first semiconductor region located on the first electrode, the first semiconductor region being of a p-type, a second semiconductor region located on the first semiconductor region, the second semiconductor region being of an n-type, a third semiconductor region located on the second semiconductor region, the third semiconductor region being of the p-type, a fourth semiconductor region located on the third semiconductor region, the fourth semiconductor region being of the n-type, and a fifth semiconductor region located on the third semiconductor region, the fifth semiconductor region being of the p-type;

a second electrode located on the semiconductor part;

a structure body including a gate part and a dummy part alternately arranged in a second direction perpendicular to a first direction, the gate part including at least one gate electrode, the dummy part including at least two dummy electrodes, the first direction being from the first semiconductor region toward the second semiconductor region; and an insulating part located between the gate electrode and the semiconductor part, the gate part being located in the fourth semiconductor region, a first potential being applied to the second electrode, a second potential being applied to the gate electrode, the second potential being greater than the first potential, a third potential being applied to the dummy electrode located at a position next to the gate part, the third potential being greater than the first potential.

Configuration 2

The device according to configuration 1, wherein the fourth semiconductor region and the fifth semiconductor region are alternately arranged in the second direction, and the dummy parts are located in the fifth semiconductor region.

Configuration 3

The device according to configuration 1, wherein the second electrode includes:

a first conductive part located on the semiconductor part; and a second conductive part located under the first conductive part, the second conductive part being positioned between two of the gate electrodes that are next to each other in the second direction, the third semiconductor region includes:

a first part; and a second part located on the first part, the fourth semiconductor region is located on the first part,

12 the fourth semiconductor region and the second part are alternately arranged in the second direction, the fifth semiconductor region is located under the second conductive part, and the dummy part is located in the second part.

Configuration 4

The device according to any one of configurations 1 to 3, wherein the third potential is equal to the second potential.

Configuration 5

The device according to any one of configurations 1 to 4, wherein the second potential is 15 V.

Configuration 6

The device according to any one of configurations 1 to 5, wherein the dummy part includes at least three of the dummy electrodes, and the first potential is applied to the dummy electrode located at a position not next to the gate part.

Configuration 7

A semiconductor device, comprising:

a first electrode;

a semiconductor part including a first semiconductor region located on the first electrode, the first semiconductor region being of a p-type, a second semiconductor region located on the first semiconductor region, the second semiconductor region being of an n-type, a third semiconductor region located on the second semiconductor region, the third semiconductor region being of the p-type, a fourth semiconductor region located on the third semiconductor region, the fourth semiconductor region being of the n-type, and a fifth semiconductor region located on the third semiconductor region, the fifth semiconductor region being of the p-type;

a second electrode located on the semiconductor part;

a structure body including a gate part and a dummy part alternately arranged in a second direction perpendicular to a first direction, the gate part including at least one gate electrode, the dummy part including at least two dummy electrodes, the first direction being from the first semiconductor region toward the second semiconductor region; and an insulating part located between the gate electrode and the semiconductor part, the gate part being located in the fourth semiconductor region, the dummy electrode that is located at a position next to the gate part is connected to the gate electrode.

Configuration 8

The device according to configuration 7, wherein the fourth semiconductor region and the fifth semiconductor region are alternately arranged in the second direction, and the dummy part is located in the fifth semiconductor region.

Configuration 9

The device according to configuration 7, wherein the second electrode includes:

a first conductive part located on the semiconductor part; and a second conductive part located under the first conductive part, the second conductive part being positioned between two of the gate electrodes that are next to each other in the second direction, the third semiconductor region includes:

a first part; and a second part located on the first part, the fourth semiconductor region is located on the first part, the fourth semiconductor region and the second part are alternately arranged in the second direction, the fifth semiconductor region is located under the second conductive part, and the dummy part is located in the second part.

Configuration 10

The device according to any one of configurations 7 to 9, wherein the dummy part includes at least three of the dummy electrodes, and the dummy electrode that is located at a position not next to the gate part is connected to the second electrode.

Configuration 11

The device according to any one of configurations 1 to 10, wherein the gate part includes three of the gate electrodes, and the dummy part includes three of the dummy electrodes, Configuration 12

A semiconductor device, comprising:

a first electrode;

a semiconductor part including a first semiconductor region located on the first electrode, the first semiconductor region being of a p-type, a second semiconductor region located on the first semiconductor region, the second semiconductor region being of an n-type, a third semiconductor region located on the second semiconductor region, the third semiconductor region being of the p-type, a fourth semiconductor region located on the third semiconductor region, the fourth semiconductor region being of the n-type, and a fifth semiconductor region located on the third semiconductor region, the fifth semiconductor region being of the p-type;

a second electrode located on the semiconductor part;

a structure body including a gate part and a dummy part alternately arranged in a second direction perpendicular to a first direction, the gate part including at least two gate electrodes, the dummy part including at least one dummy electrode, the first direction being from the first semiconductor region toward the second semiconductor region; and an insulating part located between the gate electrode and the semiconductor part, the second electrode including a first conductive part located on the semiconductor part, and a second conductive part located under the first conductive part, the second conductive part being positioned between two of the gate electrodes that are next to each other in the second direction, the third semiconductor region including a first part, and a second part located on the first part, the fourth semiconductor region being located on the first part, the fourth semiconductor region and the second part being alternately arranged in the second direction,

14 the fifth semiconductor region being located under the second conductive part, the dummy part being located in the second part, the gate part including a first gate electrode located at one end of the fourth semiconductor region in the second direction, and a second gate electrode located at an other end of the fourth semiconductor region in the second direction.

Configuration 13

The device according to configuration 12, wherein a number of the dummy electrodes included in the dummy part is one.

Thus, according to embodiments, a semiconductor device can be provided in which the loss at turn-on can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fail within the scope and spirit of the inventions. Additionally, the embodiments described above can be combined mutually.

What is claimed is:

1. A semiconductor device, comprising:

a first electrode;

a semiconductor part including:

a first semiconductor region located on the first electrode, the first semiconductor region being of a p-type, a second semiconductor region located on the first semiconductor region, the second semiconductor region being of an n-type, a third semiconductor region located on the second semiconductor region, the third semiconductor region being of the p-type, a fourth semiconductor region located on the third semiconductor region, the fourth semiconductor region being of the n-type, and a fifth semiconductor region located on the third semiconductor region, the fifth semiconductor region being of the p-type;

a second electrode located on the semiconductor part;

a structure body including a gate part and a dummy part alternately arranged in a second direction perpendicular to a first direction, the gate part including at least one gate electrode, the dummy part including at least two dummy electrodes, the first direction being from the first semiconductor region toward the second semiconductor region; and an insulating part located between the gate electrode and the semiconductor part, the gate part being located in the fourth semiconductor region, the gate electrode being electrically insulated from the second electrode, the dummy electrode located at a position next to the gate part being electrically insulated from the second electrode, and the dummy electrode being not in contact with the fourth semiconductor region.

2. The device according to claim 1, wherein the fourth semiconductor region and the fifth semiconductor region are alternately arranged in the second direction, and the dummy parts are located in the fifth semiconductor region.

3. The device according to claim 1, wherein
the second electrode includes:
   a first conductive part located on the semiconductor
   part; and
   a second conductive part located under the first con-
   ductive part, the second conductive part being posi-
   tioned between two of the gate electrodes that are
   next to each other in the second direction, and
the third semiconductor region includes:
   a first part; and
   a second part located on the first part, the fourth
   semiconductor region is located on the first part, the
   fourth semiconductor region and the second part are
   alternately arranged in the second direction, the fifth
   semiconductor region is located under the second
   conductive part, and the dummy part is located in the
   second part.
4. The device according to claim 1, wherein
the gate part includes three of the gate electrodes, and
the dummy part includes three of the dummy electrodes.
5. The device according to claim 1, wherein the dummy
electrode that is located at a position next to the gate part is
connected to the gate electrode.
6. The device according to claim 5, wherein
the fourth semiconductor region and the fifth semicon-
   ductor region are alternately arranged in the second
   direction, and
the dummy part is located in the fifth semiconductor
   region.
7. The device according to claim 5, wherein
the second electrode includes:
   a first conductive part located on the semiconductor
   part; and
   a second conductive part located under the first con-
   ductive part, the second conductive part being posi-
   tioned between two of the gate electrodes that are
   next to each other in the second direction, and
the third semiconductor region includes:
   a first part; and
   a second part located on the first part, the fourth
   semiconductor region is located on the first part, the
   fourth semiconductor region and the second part are
   alternately arranged in the second direction, the fifth
   semiconductor region is located under the second
   conductive part, and the dummy part is located in the
   second part.
8. The device according to claim 5, wherein
the dummy part includes at least three of the dummy
   electrodes, and
the dummy electrode that is located at a position not next
   to the gate part is connected to the second electrode.
9. The device according to claim 5, wherein
the gate part includes three of the gate electrodes, and
the dummy part includes three of the dummy electrodes.
10. The device according to claim 1, wherein a first
potential is applied to the second electrode, a second poten-
tial is applied to the gate electrode, the second potential is
greater than the first potential, a third potential is applied to
the dummy electrode located at a position next to the gate
part, and the third potential is greater than the first potential.
11. The device according to claim 10, wherein the second
potential is 15 V.
12. The device according to claim 10, wherein the third
potential is equal to the second potential.
13. The device according to claim 10, wherein the third
potential is equal to the second potential.

14. The device according to claim 10, wherein the dummy
part includes at least three of the dummy electrodes, and the
first potential is applied to the dummy electrode located at a
position not next to the gate part.
15. A semiconductor device, comprising:
a first electrode;
a semiconductor part including:
   a first semiconductor region located on the first elec-
   trode, the first semiconductor region being of a
   p-type,
   a second semiconductor region located on the first
   semiconductor region, the second semiconductor
   region being of an n-type,
   a third semiconductor region located on the second
   semiconductor region, the third semiconductor
   region being of the p-type,
   a fourth semiconductor region located on the third
   semiconductor region, the fourth semiconductor
   region being of the n-type, and
   a fifth semiconductor region located on the third semi-
   conductor region, the fifth semiconductor region
   being of the p-type;
a second electrode located on the semiconductor part;
a structure body including a gate part and a dummy part
   alternately arranged in a second direction perpendicular
   to a first direction, the gate part including at least one
   gate electrode, the dummy part including a first dummy
   electrode and a second dummy electrode, the first
   direction being from the first semiconductor region
   toward the second semiconductor region; and
an insulating part located between the gate electrode and
   the semiconductor part, the gate part being located in
   the fourth semiconductor region, the first dummy elec-
   trode being located between the gate part and the
   second dummy electrode, the first dummy electrode
   being adjacent to the second dummy electrode without
   the fourth semiconductor region between the first
   dummy electrode and the second dummy electrode, the
   gate electrode being electrically insulated from the
   second electrode, the first dummy electrode being
   electrically insulated from the second electrode, the
   first dummy electrode being electrically insulated from
   the second dummy electrode.
16. The device according to claim 15, wherein the second
electrode includes:
   a first conductive part located on the semiconductor part;
   and
   a second conductive part located under the first conduc-
   tive part, the second conductive part being positioned
   between two of the gate electrodes that are next to each
   other in the second direction, the third semiconductor
   region includes:
   a first part; and
   a second part located on the first part, the fourth
   semiconductor region is located on the first part, the
   fourth semiconductor region and the second part are
   alternately arranged in the second direction, the fifth
   semiconductor region is located under the second
   conductive part, and the dummy part is located in the
   second part.
17. The device according to claim 15, wherein the first
dummy electrode is electrically connected to the gate elec-
trode.

* * * * *